(12) United States Patent
Quiquempoix (10) Patent No.: US 11,057,048 B2
(45) Date of Patent: Jul. 6, 2021

(54) RATIOMETRIC GAIN ERROR CALIBRATION SCHEMES FOR DELTA-SIGMA ADCS WITH PROGRAMMABLE GAIN AMPLIFIER INPUT STAGES

(71) Applicant: Microchip Technology Incorporated, Chandler, AZ (US)

(72) Inventor: Vincent Quiquempoix, Divonne-les-Bains (FR)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 0 days.

(21) Appl. No.: 16/879,941

(22) Filed: May 21, 2020

(65) Prior Publication Data

US 2020/0373939 A1   Nov. 26, 2020

Related U.S. Application Data

(60) Provisional application No. 62/852,678, filed on May 24, 2019.

(51) Int. Cl.
   *H03M 3/00*    (2006.01)
   *H03M 1/12*    (2006.01)

(52) U.S. Cl.
   CPC ........... *H03M 3/382* (2013.01); *H03M 3/466* (2013.01); *H03M 3/496* (2013.01); *H03M 1/12* (2013.01)

(58) Field of Classification Search
   CPC ...... H03M 3/382; H03M 3/496; H03M 3/466; H03M 1/12
   See application file for complete search history.

(56) References Cited

U.S. PATENT DOCUMENTS

| 5,745,060 | A  | * | 4/1998  | McCartney | ............ | H03M 3/38  |
|           |    |   |         |           |              | 341/120    |
| 5,926,123 | A  | * | 7/1999  | Ostrom    | ............... | H03M 1/0641 |
|           |    |   |         |           |              | 341/120    |
| 6,833,803 | B2 | * | 12/2004 | Mayfield  | ............ | H03M 1/1019 |
|           |    |   |         |           |              | 341/155    |
| 8,487,792 | B2 | * | 7/2013  | Erdmann   | ............ | H03M 1/0641 |
|           |    |   |         |           |              | 341/118    |

OTHER PUBLICATIONS

International Search Report and Written Opinion, Application No. PCT/US2020/034124, 14 pages, dated Aug. 26, 2020.

* cited by examiner

*Primary Examiner* — Brian K Young
(74) *Attorney, Agent, or Firm* — Slayden Grubert Beard PLLC (57) ABSTRACT

An analog to digital converter (ADC) includes voltage and reference input terminals, a buffer circuit, and control logic. The buffer circuit includes input and output terminals and a variable resistor including resistive branches connected in parallel. The control logic is configured to, in a calibration phase, determine a given gain value for which gain error is to be calibrated, determine a set of the resistive branches in the buffer circuit to be used to achieve the given gain value, successively enable a different resistive branch of the variable resistor of the set until all resistive branches of the set have been enabled, determine an output code resulting after enabling all resistive branches of the set, and, from the output code, determine a gain error of the given gain value. The control logic is further configured to take corrective action based upon the gain error of the given gain value.

20 Claims, 7 Drawing Sheets

RATIOMETRIC GAIN ERROR CALIBRATION SCHEMES FOR DELTA-SIGMA ADCS WITH PROGRAMMABLE GAIN AMPLIFIER INPUT STAGES

RELATED APPLICATIONS

The present application claims priority to U.S. Provisional Patent Application No. 62/852,678 filed May 24, 2019, the contents of which are hereby incorporated in their entirety.

TECHNICAL FIELD

The present disclosure relates to analog to digital converters (ADC) and, more particularly, to ratiometric gain error calibration schemes for delta-sigma ADCs with programmable gain amplifier (PGA) gain input stages.

BACKGROUND

Analog-to-digital converters are used in electronics for consumers, industrial applications, etc. Typically, analog-to-digital converters include circuitry for receiving an analog input signal and outputting a digital value proportional to the analog input signal. This digital output value is typically in the form of either a parallel word or a serial digital bit string. There are many types of analog-to-digital conversion schemes such as voltage-to-frequency conversion, charge redistribution, delta modulation, as well as others. Typically, each of these conversion schemes has its advantages and disadvantages. One type of analog-to-digital converter that has seen increasing use is the switched capacitor delta-sigma converter.

The input stage of the ADC may be accomplished using a PGA or a switched-capacitor sampling circuit for both input and reference voltages. The gain of the input stage may then be determined by the ratio between the input sampling capacitor and the reference sampling capacitor or a pair of capacitors for a fully differential structure. The gain of the input stage of the ADC may be used to more closely match input of the ADC to a range over which the ADC is configured to convert analog signals into digital signals. For example, if an ADC has a range of zero to two volts, but the expected ADC input is only going to be within the range of zero to one volts, the ADC may apply a gain of two to its input so that the possible values of the ADC input will match the ADC range.

Use of gains in the input stage of the ADC may introduce gain error. Testing for gain error may use a known, accurate reference voltage. However, when ADCs are deployed in use in a variety of electronic devices, such electronic devices might not include or have access to an accurate reference voltage. Thus, self-test for such ADCs might not be possible or might not be practical. Moreover, testing an ADC may require testing each gain permutation or combination of capacitive gains in the input stages. Accordingly, testing such an ADC may be very slow, as each gain setting must be tested and may have a long settling time. Inventors of embodiments of the present disclosure have discovered systems and methods for testing ADCs that address one or more of these challenges.

SUMMARY

Embodiments of the present disclosure may include an ADC. The ADC may include an ADC voltage input terminal, an ADC reference input terminal, a buffer circuit, a multiplexer, and control logic. The buffer circuit may include a buffer voltage input terminal, a buffer voltage output terminal, and a variable resistor including resistive branches connected to each other in parallel wherein each resistive branch is individually selectable. The multiplexer may be connected between the ADC voltage input terminal and the buffer voltage input terminal and between the ADC reference input terminal and the buffer voltage input terminal. The control logic may be configured to, in a calibration phase, cause the multiplexer to route the ADC reference input terminal to the buffer voltage input terminal, determine a given gain value of the ADC for which gain error is to be calibrated, determine a set of the resistive branches in the buffer circuit to be used to achieve the given gain value, successively enable a different resistive branch of the variable resistor of the set until all resistive branches of the set have been enabled, determine an output code resulting after enabling all resistive branches of the set, and from the output code, determine a gain error of the given gain value of the ADC. The control logic may be further configured to take corrective action based upon the gain error of the given gain value of the ADC.

Embodiments of the present disclosure may include a system. The system may include an ADC reference voltage source connected to an ADC reference input terminal of any of the embodiments of ADCs above, and any of the embodiments of ADCs above.

Embodiments of the present disclosure may include methods performed by any of the systems or ADCs of the above embodiments.

DETAILED DESCRIPTION

Embodiments of the present disclosure include an ADC. The ADC may be implemented within any larger device or may be a stand-alone device. The ADC may include an ADC voltage input terminal, an ADC reference input terminal, a buffer circuit, a multiplexer, and control logic. The ADC voltage input terminal may accept voltage signals for which an analog to digital conversion is to be performed in a normal phase of operation. The ADC reference input terminal may accept voltage signals defining a range of inputs for the signals of the ADC voltage input terminal. The buffer circuit may be configured to sample signals routed to it. The buffer circuit may include a buffer voltage input terminal, a buffer voltage output terminal, and a variable resistor. The buffer voltage input terminals may be connected to the ADC reference input terminal (in a calibration phase of operation) or the ADC voltage input terminal (in a normal phase of operation) by the multiplexer. The variable resistor may include individually selectable resistive branches connected to each other in parallel. Control signals for selecting the resistive branches may be generated by the control logic. Each resistive branch may include two resistors. Each of the two resistors may be equal in magnitude to feedback resistors in the sampling circuit connected to the variable resistor. The number of resistive branches that are enabled may define the gain of the ADC. The ADC circuit may include an integration circuit such as a delta-sigma analog loop circuit to accumulate values sampled by the buffer circuit and produce the output code. The multiplexer may be connected between the ADC voltage input terminal and the buffer voltage input terminal and between the ADC reference input terminal and the buffer voltage input terminal. The control logic may be configured to, in a normal phase of operation, cause the multiplexer to route the ADC voltage input terminal to the buffer voltage input terminal. The control logic may be configured to, in a calibration phase, cause the multiplexer to route the ADC reference input terminal to the buffer voltage input terminal. The control logic may be configured to, in the calibration phase, determine a given gain value of the ADC for which gain error is to be calibrated. The control logic may be configured to, in the calibration phase, determine a set of the resistive branches in the buffer circuit to be used to achieve the given gain value. The control logic may be configured to, in the calibration phase, successively enable a different resistive branch of the variable resistor of the set until all resistive branches of the set have been enabled. The control logic may be configured to, in the calibration phase, determine an output code resulting after enabling all resistive branches of the set. The control logic may be configured to, in the calibration phase, from the output code, determine a gain error of the given gain value of the ADC. The control logic may be configured to take corrective action based upon the gain error of the given gain value of the ADC.

In combination with any of the above embodiments, the control logic may be further configured to, while successively enabling a given different resistive branch of the variable resistor of the set, disable all other resistive branches of the variable resistor.

In combination with any of the above embodiments, the control logic may be further configured to, in the calibration phase of operation, determine another gain value of the ADC for which gain error is to be calibrated, determine another set of resistive branches to be used to achieve the other gain value, successively enable subsets of the other set of resistive branches while disabling the remainder of the resistive branches until all resistive branches of the other set of the capacitors have been enabled, determine an output code resulting after enabling all resistive branches of the other set of the resistive branches, and from the output code, determine a gain error of the other gain value of the ADC. This may be repeated for any suitable gain value of the ADC.

In combination with any of the above embodiments, the control logic may be further configured to, in a normal operation mode, enable the given gain value by enabling the resistive branches of the set.

In combination with any of the above embodiments, the ADC may further include a sampling circuit. The sampling circuit may be configured to sample output of the buffer circuit, selectively apply a gain to the output of the buffer circuit, and provide the sampled output of the buffer circuit with the applied gain to an integrator circuit. The integrator circuit may be configured to add the charge values accumulated by the sampling circuit.

In combination with any of the above embodiments, the sampled output of the buffer circuit with the applied gain may have an effective gain of one with respect to voltage on the ADC reference input terminal as received by the buffer circuit.

In combination with any of the above embodiments, the given gain value of the ADC is an integer G, and the size of the set is G−1.

In combination with any of the above embodiments, each resistive branch of the set may be enabled for a same number of samples to be sampled by the sampling circuit over a conversion period. The sampling circuit may be configured to sample for a duration of (G−1) conversion periods corresponding to enablement of each resistive branch of the set. The sampling circuit may be further configured to sample for an additional conversion period corresponding to disablement of all of the resistive branches of the variable resistor. The control logic may be further configured to determine the gain error from an average of the samples from each of the (G−1) and the additional conversion periods.

In combination with any of the above embodiments, each resistive branch may be enabled for a same number of samples to be sampled by the sampling circuit over a conversion period, resulting in a total number of samples. The same number of samples may be equal to the total number of samples divided by the given gain value of the ADC.

In combination with any of the above embodiments, a quotient of the total number of samples divided by the given gain value of the ADC may have no remainders.

In combination with any of the above embodiments, the given gain value may be a multiple of 2, and the ADC may include an add and shift circuit to realize an average value of charge to determine the gain error.

Figure 1:
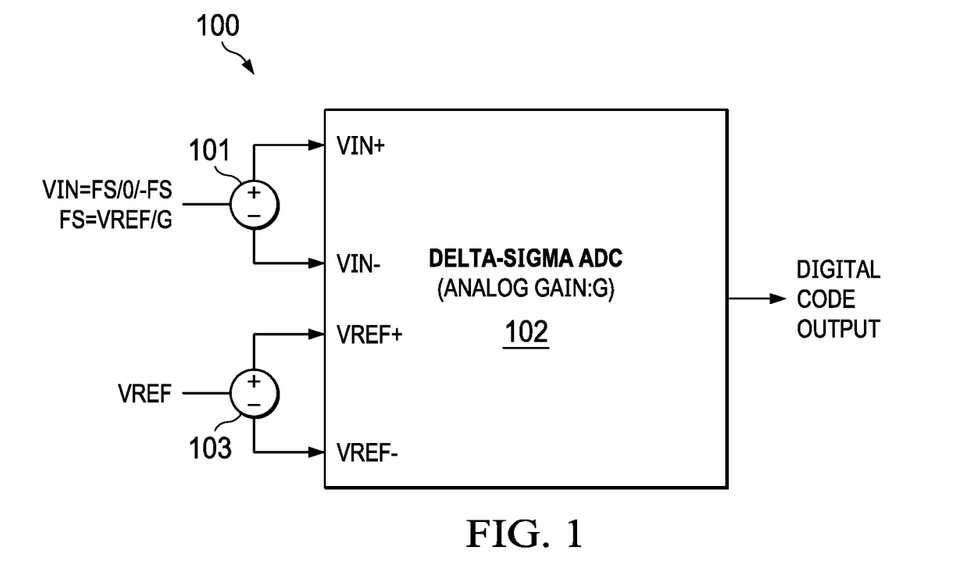
FIG. 1 is an illustration of an example system for gain error calibration for ADCs, according to some implementations.

FIG. 1 is an illustration of an example system 100 for gain error calibration for ADCs, according to some implementations. System 100 may include an ADC 102. ADC 102 may be a delta-sigma ADC. System 100 may be configured to determine gain errors in ADC 102.

ADC 102 may be configured to convert an analog input signal into a digital output code. The analog input signal may be single-ended (not shown, in which case a voltage is accepted as input and the received voltage is compared to ground) or differential, as shown in FIG. 1. The differential analog input may be the difference in voltage between the VIN+ and VIN− terminals of ADC 102, resulting in a total of VIN (VIN=VIN+−VIN−). ADC 102 may be configured to receive a reference voltage. The reference voltage may be single-ended (not shown, in which case a voltage is accepted as reference and the received reference voltage is compared to ground) or differential, as-shown in FIG. 1. The differential analog input may be the difference in voltage between VREF+ and VREF− terminals of ADC 102, resulting in a total of VREF (VREF=VREF+−VREF−). These differential voltages may be attached to a certain common-mode voltage, which is not depicted in the figure. The output code may then be a value proportional to VIN/VREF. The ADC code may be given as (ADC code=K*VIN/VREF), wherein K is a constant.

ADC 102 may have an analog gain denoted as G. This analog gain, G, amplifies the input signal VIN internally in ADC 102 so that the voltage converted by ADC 102 is actually G*VIN. In such a case, the transfer function of ADC 102 becomes (ADC code=G*K*VIN/VREF).

VREF may define the range of voltage input that can be converted by ADC 102. For a single-ended converter, the input voltage range applicable for the A/D conversion may then be [0, VREF]. For a fully-differential converter the input voltage range applicable for the A/D conversion may be [−VREF, +VEF]. When a gain G is applied, the input voltage range of ADC 102 is still the same, but is applied to G*VIN, so that effectively the input voltage range becomes [0, VREF/G] for a single-ended converter and [−VREF/G, +VREF/G] for a fully-differential converter. Outside of this range, the A/D conversions may suffer larger inaccuracies, output code may clip, and overall linearity of the converter may no longer be guaranteed.

ADC 102 may be configured to realize the analog gain, G, by various methods, but the actual transfer function performance of ADC 102 might not be exactly equal to the expected or ideal transfer function performance due to physical implementation limitations such as mismatches between analog components in ADC 102. Thus, system 100 may cause the gain to be measured and compensated for in ADC 102 to more closely approximate the desired or ideal transfer function (G*K*VIN/VREF). The error caused while implementing the gain of the transfer function is called the gain error of the ADC. The ADC transfer function may then be equal to G*K'*VIN/VREF where (K'/K−1) is the gain error at the gain G. Inventors of embodiments of the present disclosure have discovered that the gain error may vary and depend on the gain G, in addition to other parameters like temperature or power supply voltage. The gain error is the error on the slope of the linear transfer function of ADC 102. Other errors can occur and be characterized, wherein such errors occur in addition to the gain error. Such other errors may include offset errors, integral nonlinearity errors, and differential nonlinearity errors. These other may be independent of gain error and may be addressed separately.

In order to measure the gain (and therefore evaluate the gain error) of ADC 102, two measurements are performed. From these two measurements, the straight-line equation of the intersection of these data points may be extracted and the slope of the line determined. If these two points are further apart, the inaccuracies due to the measurements will become less important and may be negligible if the inaccuracy of the measurement is small compared to the voltage measured. Typically, these two measurements are made with inputs of 0 voltage and full-scale voltage range (FS) for a single-ended converter and a negative full-scale (−FS) and positive full-scale (+FS) for a fully-differential converter. A full-scale signal may include the extremity of the input voltage range. In order to maximize the accuracy of the gain error measurement, the system is generally measured wherein VIN is zero (VIN=FS=VREF/G) for a single-ended converter and VIN=−FS=−VREF/G and VIN=FS=VREF/G for a fully-differential converter). This is depicted in FIG. 1 as VIN input of ADC 102 is connected to a voltage source 101 applying −FS, 0, or +FS values. Meanwhile, VREF input of ADC 102 is connected to a voltage source 103 whose value is constant and equal to VREF.

A zero measurement may measure an offset of ADC 102. To measure an offset, zero volts may be applied at the VIN input of ADC 102 and the output of ADC 102 observed. The zero measurement may be implemented by shorting the VIN+ and Vin− inputs together, causing VIN=0 at the VIN inputs of ADC 102. This may be performed internally in ADC 102. However, it may be more difficult to generate the FS signal accurately, wherein the full input range of ADC 102 is used by a voltage input. When G=1, generating VIN with the VREF voltage may be generated through input switches that would multiplex VREF inputs and VIN inputs. However, if G is different than 1, the FS signal cannot be generated easily as it is not a simple copy of an existing voltage, such as 0 volts by shorting VIN+ and VIN−, or VREF by connecting to VREF+ and VREF− terminals. The FS=VREF/G input voltage is often generated through another voltage source or through a DAC that would use the reference voltage as the reference element. However, inventors of the present disclosure have discovered that such a FS signal may then suffer inaccuracies due to the total unadjusted error of the DAC or the inaccuracy of the reference voltage. The inaccuracy of the reference voltage may directly result in an additional source of error in the gain measurement of ADC 102, and, in some cases, may even be the dominant source of error in performance of ADC 102. Moreover, the added DAC or voltage source to generate such a reference voltage may increase the total system cost of system 100. In addition, the added DAC or voltage source to generate such a reference voltage might not be efficiently applied to ADC 102 during operation of system 100 so as to measure the gain error. In addition, a different voltage is to be generated for each new value of G that is to be tested, as a given ADC may include many different gain settings. Settling times necessary for creation of each such reference voltage may delay evaluation of ADC 102.

Therefore, inventors of embodiments of the present disclosure have discovered that a system that would measure the gain error without the need to generate the FS signals by dividing a reference voltage by the gain (VREF/G) is desired. Inventors of embodiments of the present disclosure have discovered a system that may have substantial advantages, such as no need to use an external voltage source or DAC, and less settling time. Such a system may only use the zero measurement (VIN=0) and VIN=VREF voltage instead of the full scale (VREF/G) voltage to measure the gain error, thus reducing the inaccuracy due to the voltage measurement by using the input voltage across all gains. However, using a standard ADC, it is not possible for a gain greater than one to allow an input voltage VIN to be greater than VREF/G (thus VIN*G is greater than VREF). Embodiments of the present disclosure address at least some of these issues and include an ADC that allows an input of VIN=VREF for any given gain G while still allowing accurate evaluation of the gain error.

Figure 2:
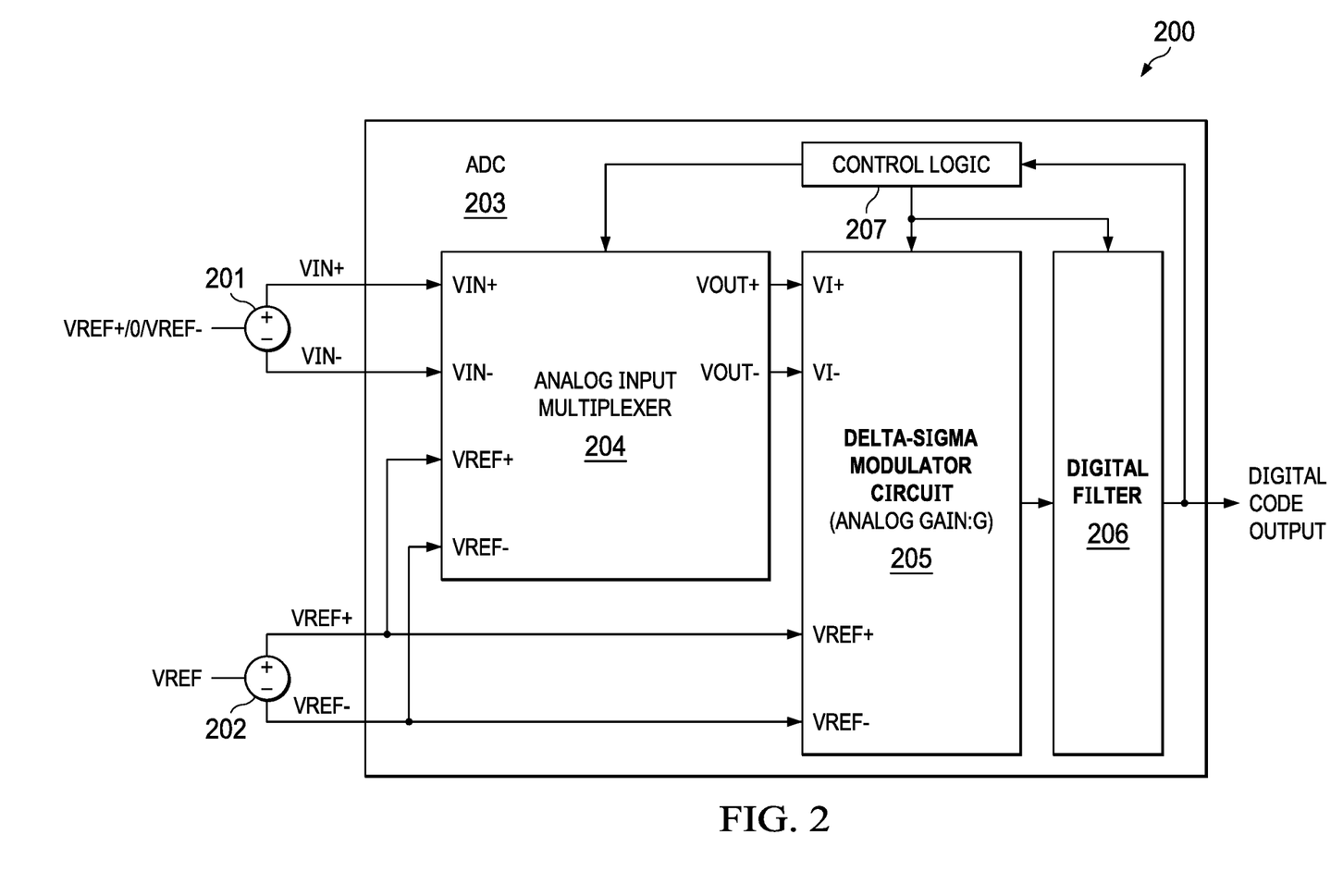
FIG. 2 is an illustration of an example system for ratiometric gain error calibration for ADCs, according to embodiments of the present disclosure.

FIG. 2 is an illustration of an example system 200 for ratiometric gain error calibration for ADCs, according to embodiments of the present disclosure.

System 200 may be applicable or include any suitable ADC, such as ADC 203. ADC 203 may be included in a microcontroller, processor, mobile device, computer, smartphone, tablet, power converter, controller, power supply, sensor, vehicle, or any other suitable electronic device. ADC 203 may be a delta-sigma ADC. Moreover, ADC 203 may include a capacitive gain input stage. System 200 may be configured to determine gain errors in ADC 203. Moreover, system 200 may be configured to calibrate operation of ADC 203 based upon any determined gain errors, or take any other suitable corrective action.

ADC 203 may include ADC voltage input terminals, such as VIN+ and VIN−. ADC 203 may include ADC reference input terminals, such as VREF+ and VREF−.

ADC 203 may be configured to convert an analog input signal into a digital output code. The analog input signal may be single-ended (not shown, in which case a voltage is accepted as input and the received voltage is compared to ground) or differential, as shown in FIG. 2. The differential analog input may be the difference in voltage between VIN+ and VIN−, resulting in a total of VIN (VIN=VIN+−VIN−). ADC 203 may be configured to receive a reference voltage. The reference voltage may be single-ended (not shown, in which case a voltage is accepted as reference and the received reference voltage is compared to ground) or differential, as shown in FIG. 2. The differential analog input may be the difference in voltage between VREF+ and VREF−, resulting in a total of VREF (VREF=VREF+−VREF−). These differential voltages may be attached to a certain common-mode which is not depicted in the figure. The output code may then be a value proportional to VIN/VREF (ADC code=K*VIN/VREF, with K being a constant.

ADC 203 may have a variable, selectable gain whose value is denoted G. This analog gain, G, amplifies the input signal VIN internally in ADC 203 so that the voltage converted by ADC 102 is actually G*VIN. In such a case, the transfer function of ADC 203 becomes: ADC code=G*K*VIN/VREF.

VREF may define the range of voltage input that can be converted by ADC 203. For a single-ended converter, the input voltage range applicable for the A/D conversion may then be [0, VREF]. For a fully-differential converter the input voltage range applicable for the A/D conversion may be [VREF−, VREF+]. When a gain G is applied, the input voltage range of ADC 203 is still the same, but is applied to G*VIN, so that effectively the input voltage range becomes [0, VREF/G] for a single-ended converter and [VREF−/G, VREF+/G] for a fully-differential converter. Outside of this range, the A/D conversions may suffer larger inaccuracies, output code may clip, and overall linearity of the converter may no longer be guaranteed.

ADC 203 may be connected to a voltage source 201. The voltage of voltage source 201 may be chosen between +/−VREF or 0. Voltage source 201 may generate voltages externally to system 200 (with an external voltage source or multiplexer), or internally to system 200. These voltages may be applied through an analog input multiplexer 204. Analog input multiplexer 204 may be implemented in any suitable manner. Analog input multiplexer 204 may be configured to generate VOUT signals (VOUT+−VOUT−) so that VOUT=+/−VREF or 0. VOUT signals may be provided to delta-sigma modulator circuit 205.

ADC 203 may be a delta-sigma ADC, thus including a delta-sigma modulator circuit 205. Delta-sigma modulator circuit 205 may be implemented in any suitable manner, such as by digital circuitry, analog circuitry, instructions for execution by a processor (not shown), or any suitable combination thereof. Delta-sigma modulator circuit 205 may include an input buffer stage with the analog gain G to be able to amplify the inputs received on the VI+/VI− input terminals. Delta-sigma modulator circuit 205 may receive reference voltage signals that are routed from the VREF+/− input terminals of ADC 203 without any modifications.

System 100 may include a voltage reference 202. Voltage reference 202 may be implemented in any suitable manner. Voltage reference 202 may generate the reference voltage for system 200. Voltage reference 202 may be internal to ADC 203 (not shown) or external to ADC 203 within system 200. Moreover, voltage reference 202 may be external to system 200.

Delta-sigma modulator circuit 205 may be configured to generate a bitstream based upon its inputs. The voltage inputs (that are to be amplified according to the gain, G) of delta-sigma modulator circuit 205 may be given as VI+ and VI−. Delta-sigma modulator circuit 205 may also include inputs for the reference voltage, given as VREF+ and VREF−. The bitstream may be sent to a digital filter 206. Digital filter 206 may be implemented by digital circuitry, analog circuitry, instructions for execution by a processor (not shown), or any suitable combination thereof. Digital filter 260 may be configured to produce a digital output code at the end of a conversion cycle, upon a time increment denoted as TCONV. TCONV may be long enough for delta-sigma modulator circuit 205 to process its inputs to generate a bitstream.

In one embodiment, system 200 may be configured to evaluate the gain error of ADC 203 for any given gain G (G integer) setting, without the need to generate different reference signals such as a +/−VREF/G signal. In another embodiment, system 200 may be configured to evaluate the gain error of ADC 203 without the need of generating any external voltage reference or DAC through use of analog input multiplexer 204 to switch existing voltages at the inputs of the delta-sigma modulator circuit 205.

ADC 203 may include control logic 207. Control logic 207 may be implemented by digital circuitry, analog circuitry, instructions for execution by a processor, or any suitable combination thereof. Control logic 207 may be configured to selectively operate ADC 203 in a calibration phase or in a normal phase. In the calibration phase, inputs of delta-sigma modulator circuit 205 may be controlled so as to operate ADC 203 in a manner that evaluates whether ADC 203 has any gain error and, based upon such a determination, adjust operation of ADC 203 to account for such gain error. In the normal phase, inputs of delta-sigma modulator circuit 205 may be controlled so as to operate ADC 203 in a manner that generates a digital code output based upon inputs from voltage source 201 and reference 202 that reflect analog signals for which system 200 requests an associated digital value. Control logic 207 may be configured to selectively operate one or more of analog input multiplexer 204, delta-sigma modulator circuit 205, and digital filter 206.

Figure 3:
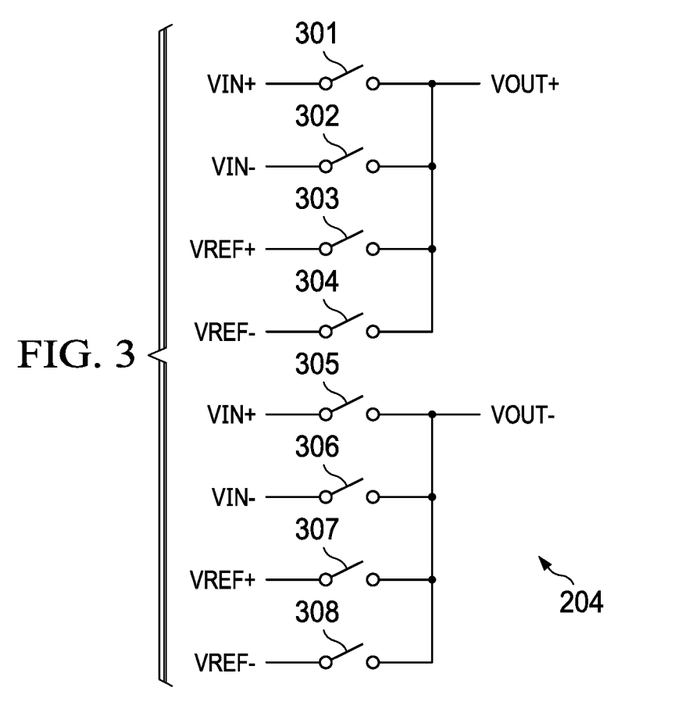
FIG. 3 illustrates an example implementation of an analog input multiplexer, according to embodiments of the present disclosure.

FIG. 3 illustrates an example implementation of analog input multiplexer 204, according to embodiments of the present disclosure. Analog input multiplexer may include eight switches 301-308. Switch 301 may connect VIN+ to VOUT+. Switch 302 may connect VIN− to VOUT+. Switch 303 may connect VREF+ to VOUT+. Switch 304 may connect VREF− to VOUT+. Switch 305 may connect VIN+ to VOUT−. Switch 306 may connect VIN− to VOUT−. Switch 307 may connect VREF+ to VOUT−. Switch 308 may connect VREF− to VOUT−. At any given time, only one of switches 301, 302, 303, 304 might be enabled, the rest being disabled. Similarly, only one of switches 305, 306, 307, 308 may be enabled, the rest being disabled, turned off. The enablement or disablement of switches in FIG. 3 may be performed at the direction of control logic 207 (not shown). This implementation allows generation of the required +/−VREF or zero differential voltages. For a zero measurement, switches 301 and 305 may be enabled, or switches 302 and 306 may be enabled. For a +VREF measurement, switches 303 and 308 may be enabled. For a −VREF measurement, switches 304 and 307 may be enabled. In each of these examples, the remainder of switches may be disabled. Although illustrated as a stand-alone component, analog input multiplexer 104 may be implemented as a specific circuit inside ADC 203, outside ADC 203, or within delta-sigma modulator circuit 205. Analog input multiplexer 204 may also include additional components and be implemented as part of a larger multiplexer, so long as analog input multiplexer 204 can connect VOUT to +/−VREF or 0 during the whole time of the A/D conversion.

Figure 4:
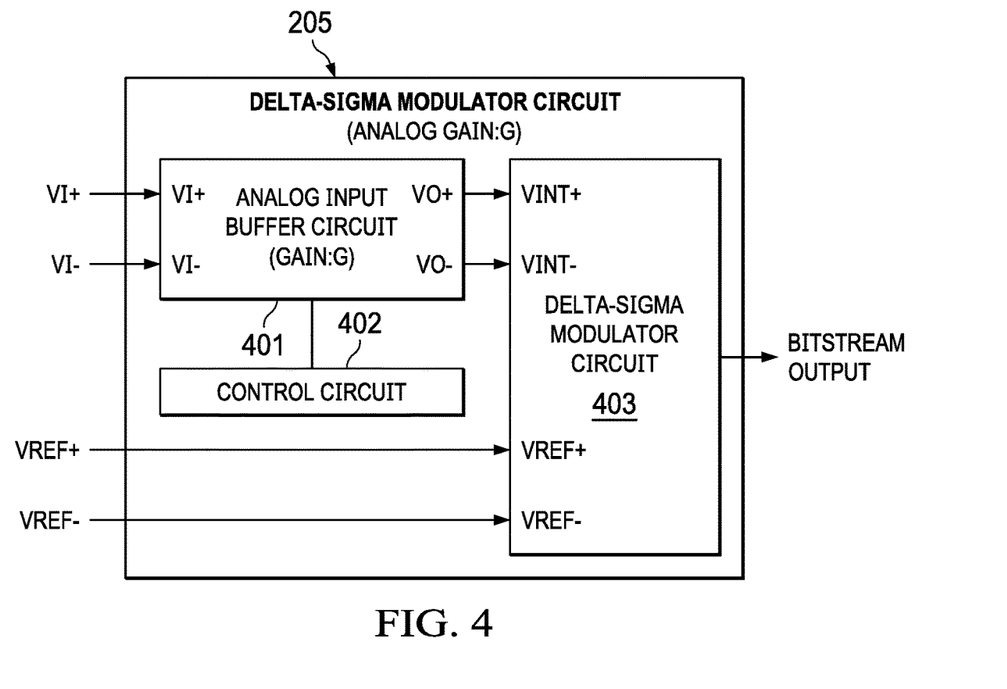
FIG. 4 is an illustration of an example implementation of a delta-sigma modulator circuit, according to embodiments of the present disclosure.

FIG. 4 is an illustration of an example implementation of delta-sigma modulator circuit 205, according to embodiments of the present disclosure.

Delta-sigma modulator circuit 205 may include a buffer circuit 401, a control circuit 402, and a delta-sigma modulator circuit 403. Buffer circuit 401, control circuit 402, and delta-sigma modulator circuit 403 may be implemented by analog circuitry, digital circuitry, instructions for execution by a processor (not shown), or any suitable combination thereof.

Buffer circuit 401 may include buffer input voltage terminals VI+ and VI−. Buffer circuit 401 may be configured to sample the input voltages on VI+ and VI−. Furthermore, buffer circuit 401 may be configured to apply a gain, G, to the input voltage signals and output these on buffer output voltage terminals VO+ and VO−. Buffer circuit 401 may be configured to operate based upon commands or signals from control circuit 402. Control circuit 402 may further receive commands or signals from control logic 207 (not shown). Delta-sigma modulator circuit 403 may be configured to generate the output bitstream that will feed digital filter 206 in ADC 203. Delta-sigma modulator circuit 403 may be configured to integrate sampled values output by buffer circuit 401 and received at delta-sigma modulator circuit 403 at its input pins VINT+/−. The reference input signals of VREF+ and VREF− may be routed with no modifications to the delta-sigma analog loop input circuit 403 reference pins, also given as VREF+ and VREF−. Delta-sigma modulator circuit 403 may be configured to implement a modulator circuit with a fixed gain. The fixed gain may be equal to, for example, one, for the purposes of the example of FIG. 4, as it does not change the gain error measurement.

Figure 5:
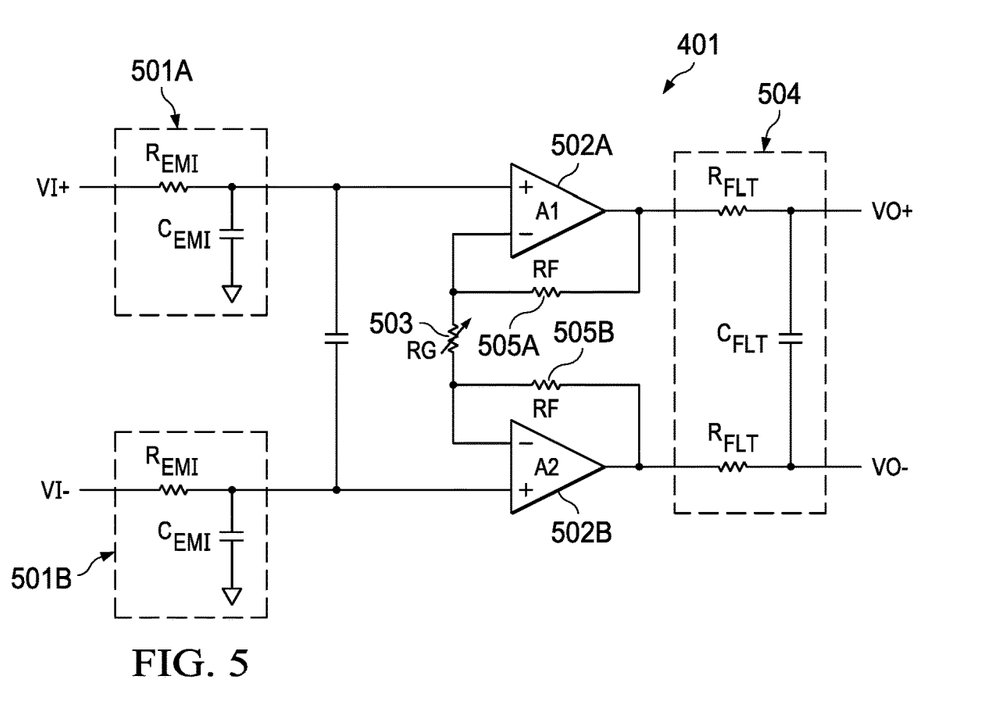
FIG. 5 is an illustration of an example implementation of a buffer circuit, according to embodiments of the present disclosure.

FIG. 5 is an illustration of an example implementation of buffer circuit 401, according to embodiments of the present disclosure.

Buffer circuit 401 as shown in FIG. 5 may incorporate a variable gain that is realized through a variable resistor 503, denoted RG. Buffer circuit 401 may be implemented as a variable gain precision input buffer through a fully differential amplifier using two separate operational amplifiers 502A and 502B, denoted A1 and A2. The implementation may be modified to produce a single-ended version of the depicted input buffer circuit 401.

Buffer circuit 401 may include input circuits 501A, 501B, created with R-C first order filters that can act as anti-aliasing filters or EMI filters. Input circuits 501 may each include an input terminal VI+/− connected to resistor, denoted as REMI, connected to a capacitor, denoted as CEMI, connected to ground. The REMI may be further connected to non-inverting terminals of respective operational amplifiers 502. Input circuits 501 may be connected on one side to respective VI+ or VI− analog inputs of buffer circuit 401, and on the other side to the non-inverting input of respective operational amplifiers 502. Operational amplifiers 502 may be matched and their implementation may be of any suitable type. The inverting input of operational amplifiers 502 may be connected to their respective output by way of a resistive feedback including respective resistors 505A, 505B, whose value may be given as RF. In between the two non-inverting inputs of operational amplifiers 502 is a variable resistor 503 whose value is denoted as RG. The outputs of each of operational amplifiers 502 are connected to another first-order R-C filter 504, which may act as an anti-aliasing filter for the inputs of the delta-sigma modulator circuit 403 (not shown) connected to output terminals VO+ and VO−. First-order R-C filter 504 may include two instances of a resistor, denoted as RFLT, connected to the outputs of respective operational amplifiers 502 and to respective output terminal pins VO+ and VO−. First-order R-C filter 504 may include a capacitor, denoted as CFLT, connected between the output terminal pins VO+ and VO−.

If the gain of the two operational amplifiers is infinite, the gain of the transfer function from VI+/− to VO+/− is equal to (G=1+2*RF/RG). Buffer circuit 401 may implement any gain G as long as variable resistor 503 satisfies the equation (RG=2*RF/(G−1)). G is then, by definition in this implementation, greater than 1, and can only be equal to 1 when RG is infinite, which may occur when the resistor RG is replaced by an open circuit (as an open circuit has an infinite resistance in a first-order approximation). Since the gain is a function of the two resistor values RF and RG, it is susceptible to mismatch between RF and RG values. Thus, buffer circuit 401 may be prone to gain errors due to resistor mismatch. Embodiments of the present disclosure may use a specific implementation of the variable resistor RG to evaluate this gain error without the need of connecting a specific voltage, such as +/−VREF/G, at the input of ADC 203.

The full-scale value of VREF should not exceed the output ranges of operational amplifiers 502. This may be performed to avoid clipping of any voltage that is multiplied by two in buffer circuit 401 when one resistor branch is selected in variable resistor 503, discussed in more detail below. The intermediate voltage (VINT+/−) might not be clipped to achieve this limitation on VREF.

Figure 6:
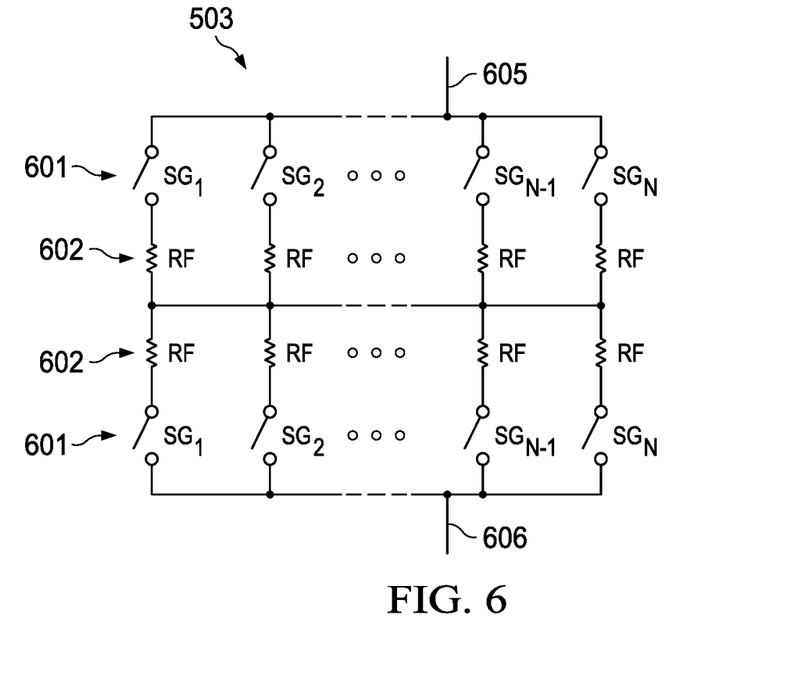
FIG. 6 illustrates an example implementation of a variable resistor, according to embodiments of the present disclosure.

FIG. 6 illustrates an example implementation of variable resistor 503, according to embodiments of the present disclosure. In one embodiment, variable resistor 503 may be implemented by a multiple, individually selectable resistive branches or paths connected in parallel. Each resistive path between a first terminal 605 and a second terminal 606 of variable resistor 503 may include two instances of a resistor 602 with a value RF connected in series. Each resistive path may be selectively enabled or disabled with switches 601. Switches 601 may be controlled with commands SG[1 . . . N]. In a given resistive path, two instances of switch 601 may be used on either end of the two instances of resistor 602 connected in series. As all resistors 602 are organized in sets in parallel, each set including a resistance of value 2*RF, when switches 601 are closed or enabled (wherein the applied commands SG[1 . . . N] is logic high, for example), the resistor value of variable resistor 503 is equal to 2RF/N. This may assume that the ON resistance of a given switch 601 can be neglected. If the switches are matched and their ON resistance is equal to RON, then the resistor value of variable resistor 503 is equal to 2(RF+RON)/N when all switches are closed or enabled. When the switches are all open or disabled (wherein the applied commands SG1[ . . . N] are logic low), variable resistor 503 may be equivalent to an open circuit with an infinite resistor value.

If implementation of variable resistor 503 as depicted in FIG. 6 is used in the implementation of buffer circuit 401 as shown in FIG. 5, then the gain of buffer circuit 401 may be defined by the commands SG[1 . . . N]. If all the commands are logic high, the maximum gain will be chosen and the gain will be equal to (G=1+2*RF/RG=N+1), assuming that the ON resistance of the switches is negligible.

If the on-resistance is not negligible in the resistor array of variable resistor 503, then the resistance of variable resistor 503 may be given as $$RG=2(RF+RON)/N$$

where N is the number of enabled resistive branches. To match this on-resistance present within variable resistor 503, the resistors 505 of FIG. 5 may be replaced or substituted with a series circuit including a resistor of the value of RF and a closed switch. The resistance of the series circuit would be (RF+RON), and the ratio between the resistances of resistor elements is still equal to N/2. Thus, the effect of non-ideal switches may be compensated-for by matching.

In variable resistor 503 in FIG. 6, if only a number k of switches 601 is enabled while the other N-k switches remain disabled, the gain would change to be equal to (G=k+1). Thus, variable resistor 503 may implement an accurate variable gain input buffer that can implement any value of gain G between 1 and N+1. The value of gain G can be obtained by enabling any combination of switches 601 by a logic high command for SG[1 . . . N] so that G−1 are enabled and the rest (N-G+1) are disabled. For example, variable resistor 503 may implement a gain of 2 by enabling any one of the SG[1 . . . N] commands while disabling all others, thus enabling a single resistive branch while disabling all other resistive branches. This is equivalent to enabling only one branch of resistors between terminals 605, 606. Variable resistor 503 may implement a gain of 1 when all switches 601 are disabled. Since resistors 602 are not perfectly matched to the resistors 505, variable resistor 503 may be prone to gain error due to resistor mismatch. Embodiments of the present disclosure may implement specific commands of the switches SG[1 . . . N] so that the gain of ADC 203 is essentially maintained at 1, but the gain error of the gain G selection can be evaluated and measured for calibration without saturating ADC 203 and with a simple input selectable between 0 and VREF to obtain zero and full scale measurements necessary to calculate the gain error.

Figure 7:
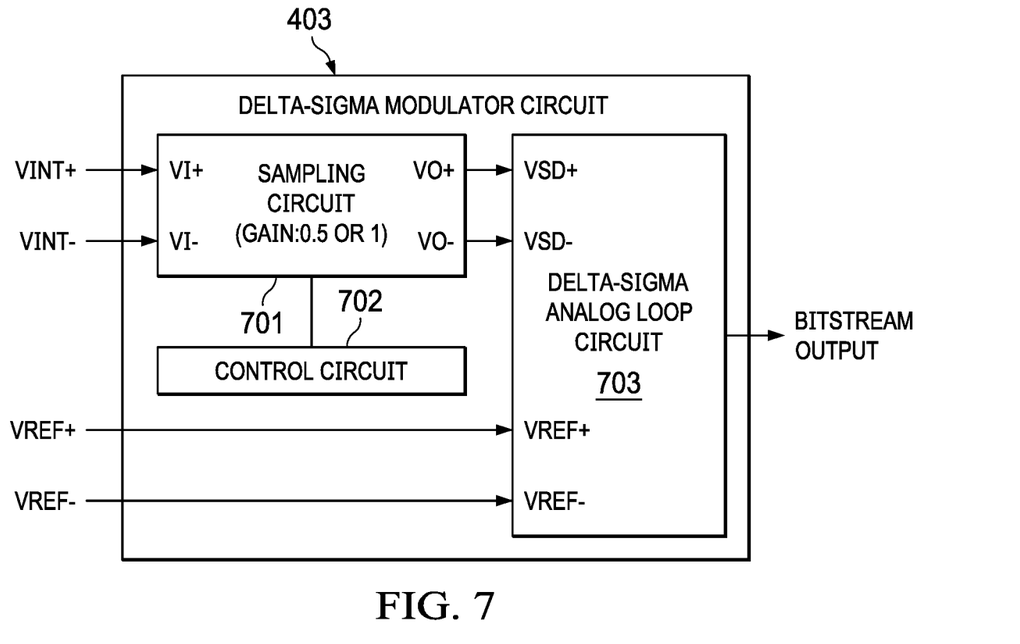
FIG. 7 illustrates an example implementation of a delta-sigma modulator loop circuit, according to embodiments of the present disclosure.

FIG. 7 illustrates an example implementation of delta-sigma modulator loop circuit 403, according to embodiments of the present disclosure.

Delta-sigma modulator loop circuit 403 may include a sampling circuit 701, a control circuit 702, and a delta-sigma analog loop circuit 703. Circuits 701, 702, 703 may be implemented by analog circuitry, digital circuitry, or any suitable combination thereof.

Sampling circuit 701 may include input voltage terminals VI+ and VI−, and output voltage terminals VO+ and VO−. Sampling circuit 701 may be configured to sample inputs at its input voltage terminals, apply a gain to its input voltage, and provide the amplified input voltage to delta-sigma analog loop circuit 703. Sampling circuit 701 may include a gain. The gain may include a selectable gain, such as a selection between 0.5× and 1×. The gain may be selected by control circuit 702. Control circuit 702 may in turn be controlled by control logic 207. Sampling circuit 701 may be configured to sample output of buffer circuit 401, selectively apply a gain to the output of buffer circuit 401, and provide the sampled output of buffer circuit 401 with the applied gain to an integrator circuit such as delta-sigma analog loop circuit 703 configured to accumulate the value of charge from sampling circuit 701. The sampled output of buffer circuit 401 may have an effective gain of one with respect to voltage on the ADC reference input terminal as received by buffer circuit 401 during calibration phase.

Delta-sigma analog loop circuit 703 may include input terminals VSD+/− connected to the outputs VO+/− of sampling circuit 701. The VREF+/− voltage reference inputs of delta-sigma modulator 403 may be connected to the VREF+/− inputs of delta-sigma analog loop circuit 703. The bitstream outputs of 703 and 403 circuits may be connected together and to digital filter 206.

A gain selection of 0.5× of sampling circuit 701 may be used so that when one resistor branch of variable resistor 503 is selected by control circuit 402, then the resulting gain is one. As shown above, a single resistor branch of variable resistor 503 may include two resistors 602 of a value RF. This may result in a gain of input buffer 401 being essentially equal to 2× (if the resistors are matched and the gain of the operational amplifiers 502 is infinite). Thus, the overall gain of ADC 203 can be equal to 1 when sampling circuit 701 is set with a gain of 0.5×. The ADC 203 gain of 1 can also be obtained by selecting a gain of 1× on both sampling circuit 701 and input buffer circuit 401 (by switching all SG[1 . . . N] commands to logic low).

Figure 8:
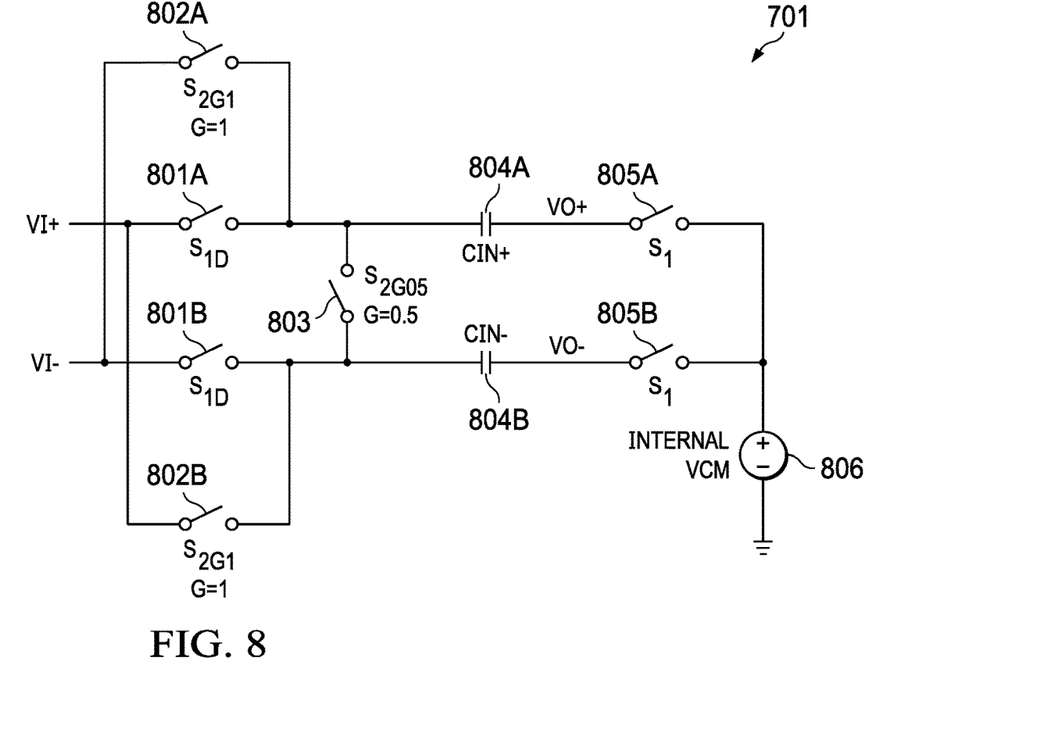
FIG. 8 illustrates an example implementation of a sampling circuit, according to embodiments of the present disclosure.

FIG. 8 illustrates an example implementation of sampling circuit 701, according to embodiments of the present disclosure. Sampling circuit 701 may implement a selectable gain of 1× or 0.5×. The sampling of the inputs VI+/− may be implemented by converting the input voltages to charge via capacitors 804 of value CIN. When a double sampling occurs on capacitors 804, the delta-sigma modulator circuit 403 effectively has a gain of 1×. If a simple sampling on capacitors 804 is performed, then the gain would be effectively 0.5×.

The sampling function may be performed through switches 801, 802, 803, 805. Control of switches 801, 802, 803, 805 may be made through control circuit 702 and control logic 207. Sampling may be performed in two phases. When the input voltages VI+/− are sampled in a first phase, the top plates (those closest to VO+/−) of capacitors 804 are effectively connected through switches 805 to a low impedance common mode voltage source 806. The command S1 controlling switches 805 is logic high, enabling or closing switches 805. In this first phase, switches 801 may connect the bottom plates (those closest to VI+/−) of capacitors 804 to the inputs VI+/−. The commands controlling switches 801 are essentially shared with the commands controlling switches 805. However, a small non-overlapping delay is applied to the commands controlling switches 801. Thus, the command controlling switches 801 may be denoted as S1D. This may allow the transfer of the sampled charges to be realized without loss. During a second phase, either switches 802 or switch 803 are enabled, depending on if the gain configuration is chosen to be respectively 1× or 0.5×. During this phase, the switch commands S1 and S1D are disabled or logic low. This second phase may be denoted as the transfer phase.

During the transfer phase, the signal from VI+/− can be resampled on capacitors 804 if switches 802 are enabled. The command signal for switches 802 may be denoted as S2G1. In such a case, switch 803 may be disabled. The sampling occurring in the first and second phases may be performed with opposite polarity, so that the charge transferred is effectively doubled. For this purpose, the outputs VO+/− are connected to a low impedance input of an integrator circuit during the second (transfer) phase so that the charge can effectively be transferred to be processed by delta-sigma modulator circuit 403. The charge difference sampled between over the first and second phases on capacitor CIN+ 804A is given by (Qdiff+=CIN+*(VI+−VI−)). Similarly, on capacitor CIN− 804B, the charge difference sampled over the first and second phases is given by (Qdiff−=CIN−*(VI−−VI+)). The total charge is given by (Qtot=Qdiff+−Qdiff−.) If both sampling capacitors 804 are matched with a value CIN, the total charge is given by (Qtot [G=1×]=2*CIN*(VI+−VI−)). The factor 2 in this equation illustrates the effective double sampling of the input voltage.

When switches 802 are disabled and switch is 803 enabled, sampling circuit 701 may be performing a simple sampling. During the transfer phase, capacitors 804 might not be connected to the input voltages of VI+/−, but are instead shorted together on their bottom plates by the operation of switch 803. The command signal for switch 803 may be given as S2G05. In this case, the charge difference sampled during the transfer phase is equal to zero. Only the charge sampled during the first phase is transferred. The total charge transferred is then equal to the charge transferred in the first phase, which is equal to: (Qtot [G=0.5×]=CIN* (VI+−VI−)) if both capacitors 804 have the same value CIN. Thus, (Qtot[G=1×]=2*Qtot[G=0.5×]).

If the given gain value of ADC 200 is an integer G, the size of the set of enabled resistive branches of variable resistor 503 may be G−1. Each resistive branch of the set may be enabled for a same number of samples to be sampled by the sampling circuit over a conversion period by control logic 207. Sampling circuit 701 may be configured to sample output of buffer circuit 401 for a duration of (G−1) conversion periods corresponding to enablement of each resistive branch of the set. Sampling circuit 701 may be configured to sample for an additional conversion period while control logic 207 disabled all of the resistive branches of the variable resistor. Control logic 207 may be configured to determine the gain error from an average of the samples from each of the (G−1) and the additional conversion periods. Each resistive branch of the set for the given gain value may be enabled for a same number of samples to be sampled by sampling circuit 701 over a conversion period, resulting in a total number of samples. The same number of samples may be equal to the total number of samples divided by the given gain value of ADC 200. The quotient of the total number of samples divided by the given gain value of ADC 200 might have no remainders. The given gain value may be a multiple of 2, so that ADC 200 includes an add and shift circuit to realize an average value of charge.

During the calibration phase of operation, control circuits 702 and 402 and control logic 207 may be configured to issue switch signals to switches 601, 802, 801, 803, 805. Such switch signals are shown in more detail in timing diagrams further below. Control logic 207 may be configured to operate multiplexer 204 to route the reference voltage input (VREF) of ADC circuit 200 to the VI+/− inputs of buffer circuit 401 during the calibration phase of operation. Control circuit 402 and control logic 207 may be configured to determine what gain value is to be tested. The determination of what gain value to test may be performed on any suitable basis, such as by a command to ADC circuit 200, register values, settings, or any other suitable input. Moreover, the possible gain values of ADC circuit 200 may be successively tested. Based on the gain value to be tested, control circuits 402, 702 and control logic 207 may be configured to determine which subsets of resistive branches of variable resistor 503 are associated with the gain value. The determination of which subsets of resistive branches of variable resistor 503 that are associated with the gain value may be made in any suitable manner, such as by reference to user commands, settings, or register values. Based upon which subsets of resistive branches of variable resistor 503 that are associated with the gain value, each subset in turn may be enabled for a determined number of samples while the remainder of the other subsets and capacitors 507 are disabled. This may be performed using control signals issued to switches 601, 802, 801, 803, 805, shown in more detail further below. The process may be repeated for each subset of resistive branches of variable resistor 503 that are associated with the gain value. During the enabling of each subset of resistive branches of variable resistor 503, ADC circuit 200 may have an effective gain of one. Each subset of resistive branches of variable resistor 503 may be enabled for a same number of samples. After all subsets of resistive branches of variable resistor 503 that are associated with the gain value have been enabled, the same number of samples may be taken while all of resistive branches of variable resistor 503 are shut off. The values stored in sampling circuit may be integrated by delta-sigma analog loop circuit 703, which may generate an output code in the form of a bitstream. Control logic 207 may be configured to take corrective action based on the gain error based determined from the output code to correct for the gain error. Control logic 207 may determine another gain value of ADC circuit 200 for which ADC circuit 200 is to be calibrated, determine another set of resistive branches of variable resistor 503 used to achieve this other gain value, successively enable subsets of the set of resistive branches of variable resistor 503 while disabling the remainder of resistive branches of variable resistor 503, determine another output code that has resulted from enabling all of resistive branches of variable resistor 503 from the other set, and, from the other output code, determine another gain error of the other gain value of ADC circuit 200. Control logic 207 may be configured to cause sampling of each subset of the set of resistive branches of variable resistor 503 for a subset of a total number of samples. The total number of samples may be performed across all subsets for a given gain value. The total number of samples taken for the given gain value divided by the given gain value is the number of samples in each subset of the total number of samples. The total number of samples divided by the gain value might have no remainders. Control logic 207 may be configured to, in a normal operation mode, enable a selected gain value by enabling associated resistive branches of variable resistor 503 at the same time.

Figure 9:
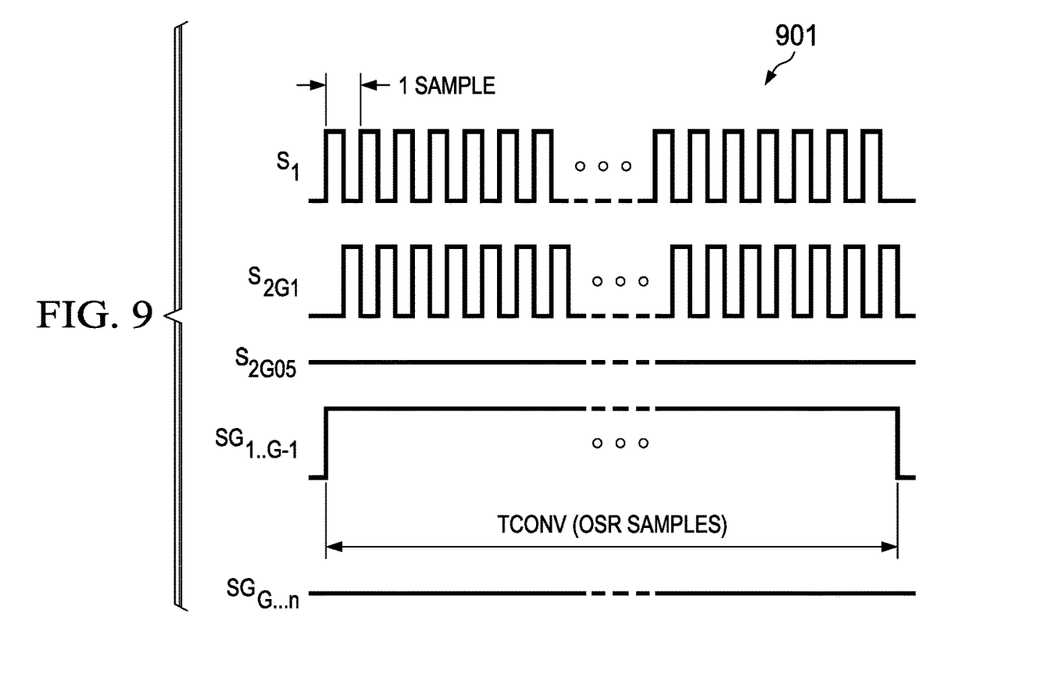
FIG. 9 illustrates a timing diagram of commands generated by a control circuit for a sampling circuit, according to embodiments of the present disclosure.

FIG. 9 illustrates a timing diagram 901 of commands generated by control circuit 702 for sampling circuit 701, according to embodiments of the present disclosure.

Timing diagram 901 illustrates commands S1, S2G1 and S2G05 for application in the sampling circuit 701 for use of a desired gain of 1×. Each sample period time of the delta-sigma conversion may be denoted as TCONV. One conversion includes the taking of a quantity OSR of samples over the conversion time of TCONV. Each sample is divided into two phases. In the first phase, S1 may be set to logic high and S2G1 may be set to logic low, implementing a first sample on capacitors 804. S113 is not specifically depicted but may be a copy of S1 with a small non-overlapping delay whose length is negligible against the time of one sample. During the entire conversion, the S2G05 command is maintained as logic low, so switch 803 is disabled. During the second phase of each sample, the S1 is toggled logic low and S2G1 is toggled logic high, so that the capacitors 804 are again sampling the input voltages with the opposite sign. The charge stored is transferred to delta-sigma analog loop circuit 703. Timing diagram 901 depicts the behavior of ADC 203 when the sampling circuit gain is chosen to be 1×. This may be a typical or preferred case as a double sampling is performed in such case. This may improve the signal-to-noise ratio of ADC 203. Timing diagram 901 shows all the SG[1 ... G−1] commands for switches 601 to be activated (logic high) while all other SG[G ... N] commands are disabled during the entire conversion time. These commands realize the gain G in input buffer circuit 401 and therefore the equivalent ADC gain is effectively G. Timing diagram 901 depicts the standard case of ADC gain which is equal to G, realized through the combination of sampling circuit 701 and input buffer 401 respectively set to have gains of 1 and G during the conversion.

Figure 10:
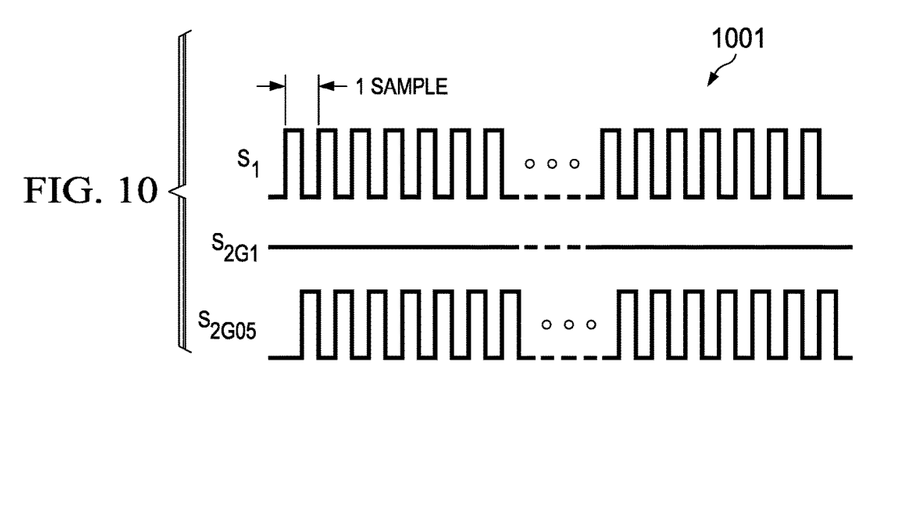
FIG. 10 illustrates a timing diagram of further commands generated by a control circuit for a sampling circuit, according to embodiments of the present disclosure.

FIG. 10 illustrates a timing diagram 1001 of further commands generated by control circuit 702 for sampling circuit 701, according to embodiments of the present disclosure.

Timing diagram 1001 illustrates commands for applications wherein input sampling circuit 701 is configured to produce a gain of 0.5. In such a case, the S1 (and S1D) commands are unchanged compared to the case of the gain of 1 illustrated in FIG. 9. The S2G1 commands are maintained logic low during the entire conversion time TCONV which disables switches 802. Timing diagram 1001 may illustrate a first and second phase. In the first phase, S1 commands are logic high and the S2G05 command is logic low. In the second phase, S1 commands are logic low and the S2G05 command is logic high. The command S2G05 is only logic high during the second (transfer) phase. The combination of the different commands implement a simple sampling and charge transfer of the analog input voltages on capacitors 804 of sampling circuit 701, which thus is configured to produce an analog gain of 0.5 (half the charge transferred as compared to the analog gain of 1).

Figure 11:
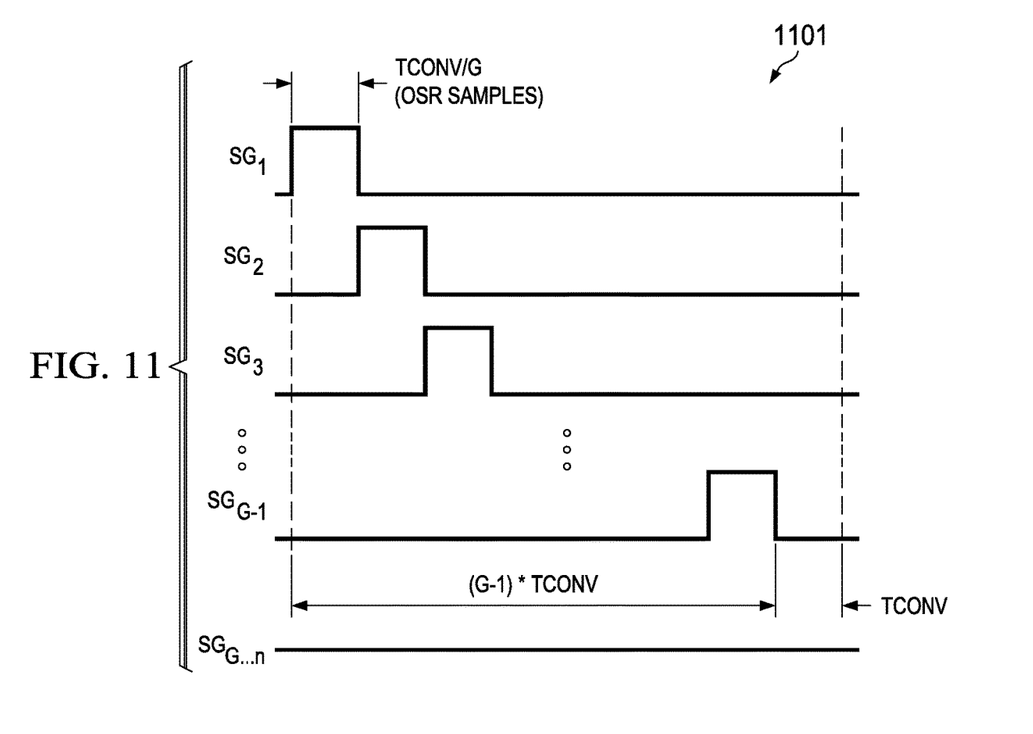
FIG. 11 illustrates a timing diagram of commands generated by a control circuit which when combined with the timing diagram of FIG. 10 provides an effective gain of 1 for an ADC, according to embodiments of the present disclosure.

FIG. 11 illustrates a timing diagram 1101 of commands generated by control circuit 702 which when combined with the timing diagram 1001 of FIG. 10 provides an effective gain of 1 for ADC 203, according to embodiments of the present disclosure.

In timing diagram 1101, the SG[1 ... G−1] commands are set to logic high consecutively, with only one such command set to logic high at a time. Each one is enabled during a full conversion time TCONV including a quantity OSR of samples. In timing diagram 1101, a quantity G of conversions are performed consecutively. In each of the first (G−1) conversions, only one branch of resistors is selected in variable resistor 503. If all resistors 602 are matched and are of the same value RF, the effective gain realized by this timing diagram is effectively 2 as per the teachings of this disclosure. If combined with the timing diagram 1001, the effective gain of ADC 203 is then equal to 1 as sampling circuit 701 gain is chosen to be 0.5. However, if the resistors are not matched then the gain error of buffer circuit 401 is dependent on the resistor value, as (G=1+2RF/RG). The last conversion in timing diagram 1101 shows that SG[1 ... N] are all logic low, so that all switches are off. This may correspond to an effective gain of 1 for buffer circuit 401 per the teachings of this disclosure. In this case, sampling circuit 701 gain is chosen to be equal to 1× so that the effective gain of ADC 203 is also equal to 1, thus matching the effective gain for all other conversions. Overall, a quantity G of conversions are performed, wherein each conversion has an effective gain of 1× for ADC 203 if all resistors have a perfect matching. However, each has in practice a different gain. The average of these conversions will yield a representation of the gain error of ADC 203 that is a known function of the same gain error that would otherwise be experienced by ADC 203 when a gain of G is used in input buffer circuit 401.

If all resistors 602 include a mismatch, the value of the equivalent resistor when SG[1 ... G−1] switches are enabled (neglecting the ON resistance of the input switches) can be written as (1/Req=Σ{1/(2RFk)}), wherein k ranges from 1 to G−1, and 2RFk is the value of the two resistors 602 in series, each of the resistor pairs having a resistance nominal value of 2RF. If all resistors are perfectly matched, then 2RFk=2RF. If all resistor branches are matched, then (Req=RG=2RF/(G−1)).

For a gain G, using the timing diagram 901, the gain of the circuit may be given as (Gmismatch=1+2RF*Σ{1/(2RFk)}), wherein k ranges from 1 to G−1. Gmismatch is equal to G (and thus the gain of ADC 203) when all resistors 602 are matched to 2RF. The gain error is defined then as (Gerr [gain=G]=(Gmismatch−G)/G=(1+RF*Σ {1/RFk}−G)/G), wherein k ranges from 1 to G−1.

In the case of the combination of the timing diagrams 1001 and 1101, the gain Gk for the k-th conversion in the timing diagram 1101 is equal to 1+2*RF/(2RFk) for buffer circuit 401 and 0.5 for sampling circuit 701. This combination gives an ADC gain of (Gk=0.5*(1+RF/RFk)). This gain, Gk, is equal to 1 if the RFk value equals RF. Moreover, GG (the gain of the last conversion) is equal to 1 as the equivalent resistor chosen is infinite (all switches are opened). The average gain used during the G conversions is then equal to (Gavg=0.5/G*Σ{RF/RFk+G−1+2}), wherein k ranges from 1 to G−1. The gain error in this case is then given by (Gerr=(1+Σ{RF/RFk}−G)/2G=Gerr[gain=G]/2). It can be observed that there is a direct relationship between the average gain error resulting from use of timing diagram 1101 and the typical case if the gain G is selected on ADC 203.

An average of the gain error arising in each of the conversions of timing diagram 1101 can be determined in digital filter 206. ADC 203 may perform averaging of these conversions using the full scale of signal VREF. This may be possible because the effective gain is 1 in all conversions, allowing gain error to be fully determined by a full-scale measurement. ADC 203 may thus fully evaluate the value of the gain error of ADC 203 for a given selection of the gain G, as the gain error average is half of the gain error attributable to the gain selection of the gain G. Thus, the gain error average provides a simple and accurate representation of the gain error of the converter for any gain G. Furthermore, the gain error average is determined while keeping an effective gain of 1, which removes the need to generate reference voltages of quantities such as +/−VREF/G. The input scale can be kept to the full value VREF during the entirety of the measurement, which facilitates the extraction of gain error.

Timing diagram 1101 may be modified to shuffle the order of the conversions into any suitable order. The order of conversions might have no effect on the final average. Timing diagram 1101 may also be modified to add a delay between conversions to allow for buffer circuit 401 to settle to a correct operating state every time the selection of variable resistor 503 (and therefore its gain) is changed. The gain chosen may be a multiple of 2 so that the averages are easier to perform inside digital filter 206, accomplished with a sum and shift operation or circuit instead of a full divider circuit.

Figure 12:
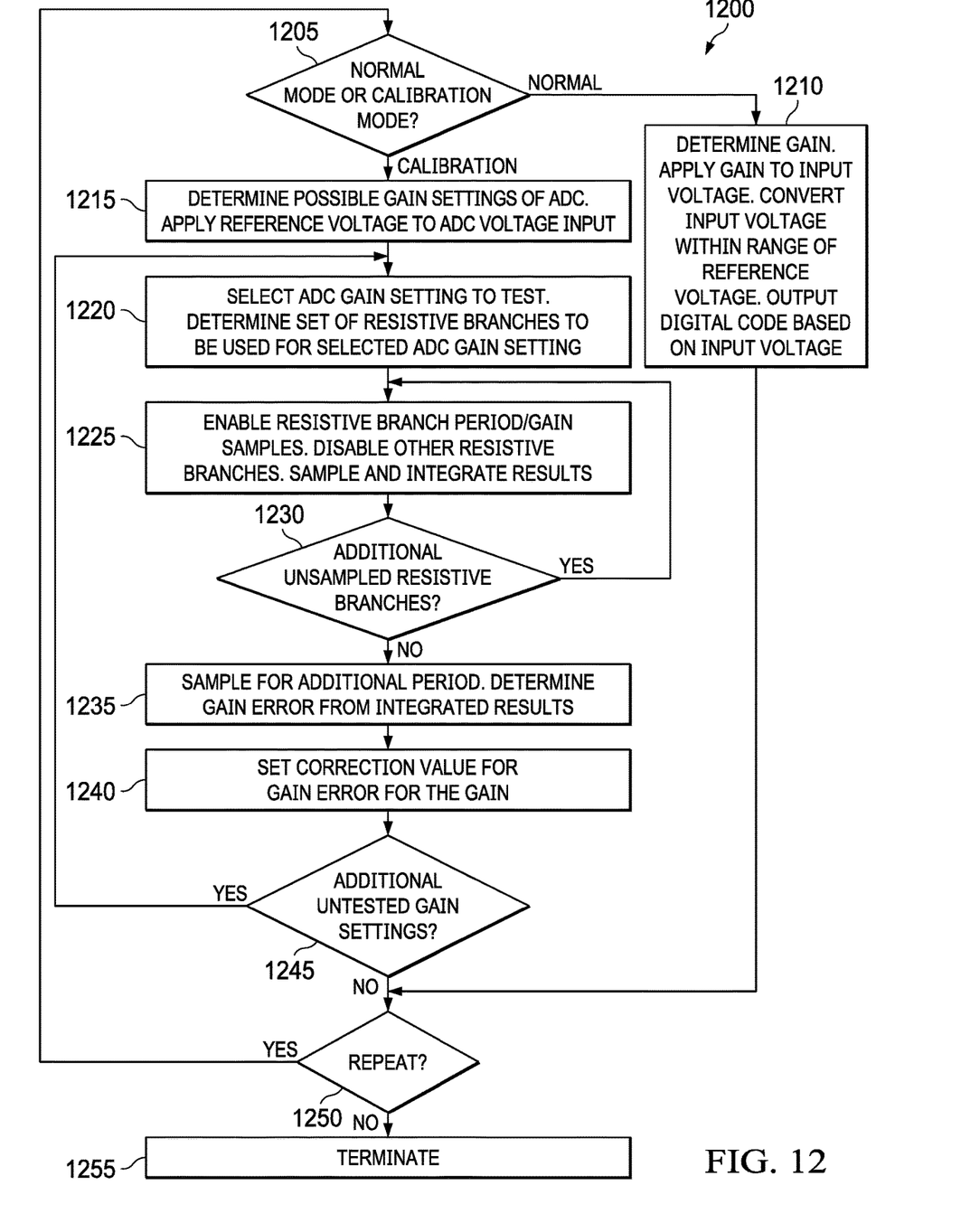
FIG. 12 illustrates an example method for determining ratiometric gain error for ADCs with capacitive gain input stages, according to embodiments of the present disclosure.

FIG. 12 is an example method 1200 for determining ratiometric gain error for ADCs with capacitive gain input stages, according to embodiments of the present disclosure. Method 1200 may include more or fewer steps that those shown in FIG. 12. Moreover, various steps of method 1200 may be omitted, repeated, performed in parallel, performed in a different order, or performed recursively. Method 1200 may be implemented by elements of FIGS. 2-8 using timing diagrams shown in FIGS. 9-11. In particular, method 1200 may be performed, directly or indirectly, by control logic 207.

At step 1205, it may be determined whether to operate the ADC in a normal phase or in a calibration phase. If the ADC is to be operated in a normal phase, method 1200 may proceed to step 1210. Otherwise, method 1200 may proceed to step 1215.

At step 1210, a gain to be used in the ADC may be determined. The gain may be applied to an input voltage that is to be converted to a digital value. After applying the gain, the input voltage may be converted within a range defined by a reference voltage range of the ADC. A digital code may be output from the ADC that is based upon the input voltage. Method 1200 may proceed to step 1250.

At step 1215, the different possible gain settings of the ADC may be determined. Furthermore, the reference voltage of the ADC may be applied to the ADC voltage input.

At step 1220, an untested ADC gain setting may be selected for test. A set of resistive branches in a variable resistor that are to be used for the selected ADC gain setting may be determined.

At step 1225, a subset of resistive branches, such as a single branch, may be enabled. The branch may be enabled for a length of time sufficient to capture a quantity of samples defined by the sample period divided by the gain. While the branch is enabled, the other branches may be disabled. At the end of the sample period, the results may be integrated.

At step 1230, it may be determined whether there are additional unsampled resistive branches from the determined set of resistive branches from step 1220. If so, method 1200 may repeat at, for example, step 1225. Otherwise, method 1200 may proceed to step 1235.

At step 1235, an additional period of samples may be taken. Gain error may be determined from the integrated results for the selected gain setting. At step 1240, a correction value for gain error for the gain may be set for future operation in normal phase.

At step 1245, it may be determined whether there are additional gain settings that are untested. If so, method 1200 may repeat at, for example, step 1220. Otherwise, method 1200 may proceed to step 1250.

At step 1250, it may be determined whether method 1200 is to repeat. Method 1200 may repeat based upon any suitable criteria, such as whether a larger device or system in which the ADC is implemented has commanded the ADC to continue operating or to halt. If method 1200 is to repeat, method 1200 may return to, for example, step 1205. Otherwise, method 1200 may terminate at step 1255.

Embodiments of the present disclosure might not require any additional voltage source beyond VREF to perform gain error calibration for different gain values. Embodiments of the present disclosure might not require VREF to be precisely generated. VREF is applied to both inputs of delta-sigma modulator circuit 403, and thus the solution of determining gain error may be said to be ratiometric. Moreover, embodiments of the present disclosure might not require a precision voltage source or equipment to measure gain error. Embodiments of the present disclosure may utilize any available direct current voltage with sufficiently low noise as VREF. Generation of a precise value of VREF/G, as performed in other solutions for testing gain error, might be unnecessary. In addition, as VREF is used as VIN input during calibration, any noise or other non-ideality arising from the generation of VREF may be cancelled through the ratiometric measurement. Furthermore, calibration may be performed without waiting for settling time of inputs in between conversions.

The present disclosure has been described in terms of one or more embodiments, and it should be appreciated that many equivalents, alternatives, variations, and modifications, aside from those expressly stated, are possible and within the scope of the disclosure. While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein.

What is claimed is:

1. An analog to digital converter (ADC), comprising:
an ADC voltage input terminal;
an ADC reference input terminal;
a buffer circuit including:
   a buffer voltage input terminal;
   a buffer voltage output terminal; and
   a variable resistor including a plurality of resistive branches connected to each other in parallel, wherein each resistive branch is individually selectable;
a multiplexer connected between the ADC voltage input terminal and the buffer voltage input terminal and between the ADC reference input terminal and the buffer voltage input terminal; and
control logic configured to, in a calibration phase:
   cause the multiplexer to route the ADC reference input terminal to the buffer voltage input terminal;
   determine a given gain value of the ADC for which gain error is to be calibrated;
   determine a set of the plurality of resistive branches in the buffer circuit to be used to achieve the given gain value;
   successively enable a different resistive branch of the variable resistor of the set until all resistive branches of the set have been enabled;
   determine an output code resulting after enabling all resistive branches of the set; and
   from the output code, determine a gain error of the given gain value of the ADC;
wherein the control logic is further configured to take corrective action based upon the gain error of the given gain value of the ADC.

2. The ADC of claim 1, wherein each resistive branch of the variable resistor includes an individual pair of resistors matched to each other and to feedback resistors of the buffer circuit.

3. The ADC of claim 1, wherein the control logic is further configured to, while successively enabling a given different resistive branch of the variable resistor of the set, disable all other resistive branches of the variable resistor.

4. The ADC of claim 3, wherein the control logic is further configured to, in a normal operation mode, enable the given gain value by enabling the resistive branches of the set.

5. The ADC of claim 1, further comprising a sampling circuit configured to:
sample output of the buffer circuit;
selectively apply a gain to the output of the buffer circuit; and
provide the sampled output of the buffer circuit with the applied gain to an integrator circuit.

6. The ADC of claim 5, wherein the sampled output of the buffer circuit with the applied gain has an effective gain of one with respect to voltage on the ADC reference input terminal as received by the buffer circuit.

7. The ADC of claim 1, wherein:
the given gain value of the ADC is an integer G; and
a size of the set is G−1.

8. The ADC of claim 7, further comprising a sampling circuit, wherein:
each resistive branch of the set is enabled for a same number of samples to be sampled by the sampling circuit over a conversion period;
the sampling circuit is configured to sample for a duration of (G−1) conversion periods corresponding to enablement of each resistive branch of the set;
the sampling circuit is further configured to sample for an additional conversion period corresponding to disablement of all of the resistive branches of the variable resistor; and
the control logic is further configured to determine the gain error from an average of the samples from each of the (G−1) and the additional conversion periods.

9. The ADC of claim 1, wherein:
the given gain value of the ADC is an integer G;
each resistive branch of the set is enabled for a same number of samples to be sampled by the sampling circuit over a conversion period, resulting in a total number of samples; and
the same number of samples is equal to the total number of samples divided by the given gain value of the ADC.

10. The ADC of claim 9, wherein a quotient of the total number of samples divided by the given gain value of the ADC has no remainders.

11. The ADC of claim 10, wherein:
the given gain value is a multiple of 2; and
the ADC includes an add and shift circuit to realize an average value of charge.

12. A method, comprising, during a calibration phase of an analog to digital converter (ADC):
routing an ADC reference input terminal of the ADC to a buffer voltage input terminal of a buffer circuit of the ADC;
determining a given gain value of the ADC for which gain error is to be calibrated;
determining a set of a plurality of resistive branches of a variable resistor in the buffer circuit to be used to achieve the given gain value, the resistive branches connected to each other in parallel and individually selectable;
successively enabling a different resistive branch of the variable resistor of the set until all resistive branches of the set have been enabled;
determining an output code resulting after enabling all resistive branches of the set; and
from the output code, determining a gain error of the given gain value of the ADC;
taking corrective action based upon the gain error of the given gain value of the ADC;
wherein the method further comprises, during a normal phase of the ADC, apply the corrective action determined during the calibration phase.

13. The method of claim 12, wherein each resistive branch of the variable resistor includes an individual pair of resistors matched to each other and to feedback resistors of the buffer circuit.

14. The method of claim 12, further comprising, while successively enabling a given different resistive branch of the variable resistor of the set, disabling all other resistive branches of the variable resistor.

15. The method of claim 14, further comprising, in a normal operation mode, enabling the given gain value by enabling the resistive branches of the set.

16. The method of claim 12, further comprising, with a sampling circuit:
sampling output of the buffer circuit;
selectively applying a gain to the output of the buffer circuit; and
providing the sampled output of the buffer circuit with the applied gain to an integrator circuit.

17. The method of claim 16, wherein the sampled output of the buffer circuit with the applied gain has an effective gain of one with respect to voltage on the ADC reference input terminal as received by the buffer circuit.

18. The method of claim 12, wherein:
the given gain value of the ADC is an integer G; and
a size of the set is G−1.

19. The method of claim 18, further comprising:
enabling each resistive branch of the set for a same number of samples to be sampled over a conversion period;
sampling for a duration of (G−1) conversion periods corresponding to enablement of each resistive branch of the set;
sampling for an additional conversion period corresponding to disablement of all of the resistive branches of the variable resistor; and
determining the gain error from an average of the samples from each of the (G-1) and the additional conversion periods.

20. The method of claim 12, wherein:
the given gain value of the ADC is an integer G;
the method includes enabling each resistive branch of the set for a same number of samples to be sampled by the sampling circuit over a conversion period, resulting in a total number of samples; and
the same number of samples is equal to the total number of samples divided by the given gain value of the ADC.

* * * * *